United States Patent [19]
Ando et al.

[11] Patent Number: 5,598,986
[45] Date of Patent: Feb. 4, 1997

[54] COMPONENT SUPPLY APPARATUS

[75] Inventors: Takashi Ando; Shuuichi Kubota; Kazuhiko Narikiyo, all of Kofu; Takao Naito, Yamanashi-ken, all of Japan

[73] Assignee: Matsushita Electric Industrial Co., Ltd., Osaka-fu, Japan

[21] Appl. No.: 377,150

[22] Filed: Jan. 24, 1995

[30] Foreign Application Priority Data

Jan. 24, 1994 [JP] Japan .................................. 6-005960

[51] Int. Cl.⁶ .................................................. B65H 75/02
[52] U.S. Cl. ........................................ 242/597.6; 242/609
[58] Field of Search .................................. 242/529, 538, 242/538.1, 597.6, 599.4, 609, 609.3, 610.5, 610.6, 613

[56] References Cited

U.S. PATENT DOCUMENTS

| | | | |
|---|---|---|---|
| 2,585,999 | 2/1952 | Bunch | 242/610.6 |
| 3,389,872 | 6/1968 | Lyman | 242/610.6 |
| 3,395,872 | 8/1968 | Fattori | 242/610.6 |
| 3,620,468 | 11/1971 | Amour | 242/597.6 |
| 3,722,929 | 3/1973 | Gilman | 242/597.6 |
| 3,973,740 | 8/1976 | Schankler | 242/613 |
| 4,039,156 | 8/1977 | Abraham | 242/613 |
| 4,440,355 | 4/1984 | Mori et al. | 242/538 |
| 4,687,152 | 8/1987 | Hawkswell | 242/538 |
| 4,893,764 | 1/1990 | Juntunen | 242/608.3 |
| 5,114,089 | 5/1992 | Posso | 242/608.6 |

FOREIGN PATENT DOCUMENTS

| | | | |
|---|---|---|---|
| 0430548A1 | 6/1991 | European Pat. Off. | 242/610.6 |
| 1-92154 | 4/1989 | Japan | 242/538 |
| 6-156880 | 6/1994 | Japan | 242/609 |
| 1577314 | 10/1980 | United Kingdom | 242/609 |

*Primary Examiner*—John P. Darling
*Attorney, Agent, or Firm*—Wenderoth, Lind & Ponack

[57] ABSTRACT

A component supply apparatus for sequentially supplying components to a predetermined position by separating a covering tape from an accommodating tape. The components are accommodated in the accommodating tape at predetermined intervals along a longitudinal direction of the tape. The components are covered with the covering tape. The apparatus includes a reel around which the separated covering tape is wound. The reel includes a reel body having a winding barrel removably mounted on a driving shaft and a guide flange positioned at one end of the driving shaft and a guide flange positioned at one end of the driving shaft. An inelastic auxiliary ring is provided so as to wind the covering tape about the peripheral surface thereof. The ring includes a rotation preventing portion and is removably mounted on a peripheral surface of the winding barrel.

15 Claims, 9 Drawing Sheets

COMPONENT SUPPLY APPARATUS

BACKGROUND OF THE INVENTION

The present invention relates to a component supply apparatus and more particularly to a component supply apparatus for sequentially supplying components to a predetermined position by separating a covering tape from an accommodating tape, while the components accommodated in the accommodating tape at predetermined intervals in the longitudinal direction thereof ARE being moved with the components covered with the covering tape.

Figure 1A:
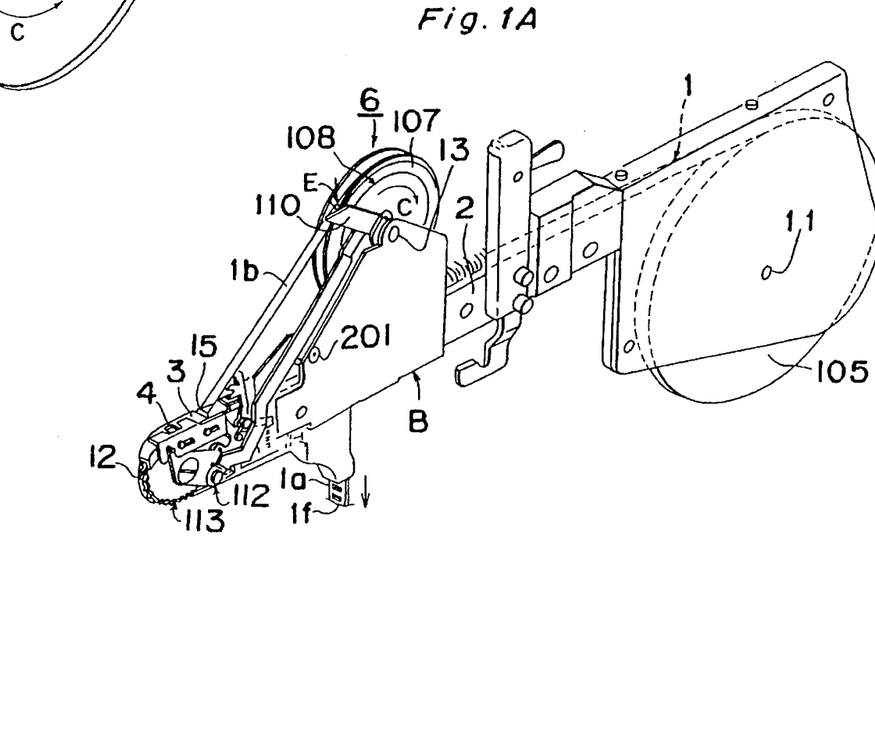
FIG. 1A is a perspective view showing a component supply apparatus according to a first embodiment of the present invention.
Figure 1B:
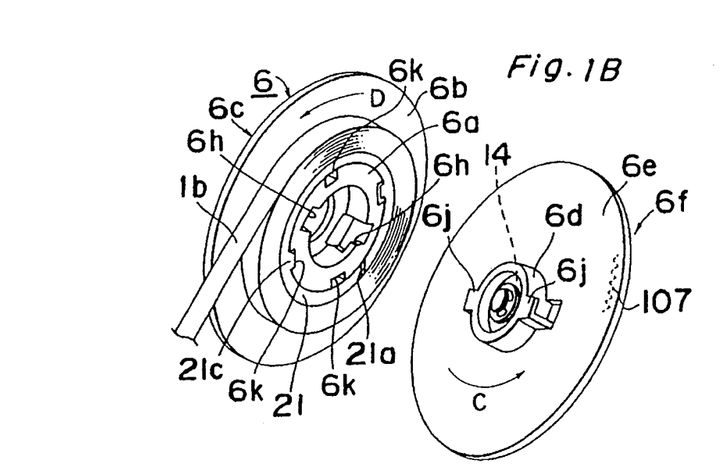
FIG. 1B is a perspective view showing an exploded reel for winding a covering tape thereon in the apparatus.

Referring to FIG. 1 showing a component supply apparatus of an embodiment of the present invention and including conventional portions described below, an example of a conventional component supply apparatus of this kind is described below. Components 1 accommodated by an accommodating tape 1a are pulled out along the upper surface of a component supply guide 2 and moved toward a component supply opening 4 of a cover 3 covering the leading end of the component supply guide 2. While the taped components 1 are being moved, a covering tape 1b is separated from the accommodating tape 1a accommodating the components 1 and wound around a winding barrel 6a of a reel 6. As a result, the accommodating tape 1a is fed to the component supply opening 4, with a component accommodating portion 1c thereof exposed to the outside as a result of the separation of the covering tape 1b therefrom. In this manner, the component 1 is picked up through the component supply opening 4.

When one type of components are to be replaced with another kind of components, it is necessary to remove the covering tape 1b from the reel 6 around which the covering tape 1b has been wound.

In order to facilitate the removal of the covering tape 1b from the reel 6, a reel body 6c comprising the winding barrel 6a of the reel 6 and a guide flange 6b positioned at one end of the winding barrel 6a in the axial direction thereof is separated from a driving shaft 6d and a driving-side guide flange 6e. Then, the covering tape 1b is removed from the winding barrel 6a of the reel body 6c separated from the driving shaft 6d and the driving-side guide flange 6e.

The covering tape 1b is wound around the winding barrel 6a by separating the covering tape 1b from the accommodating tape 1a. Thus, separation resistance is applied to the covering tape 1b. As a result, frequently, the covering tape 1b is wound comparatively tight around the winding barrel 6a of the reel 6.

Accordingly, the covering tape 1b cannot be easily removed from the winding barrel 6a. In addition, the guide flange 6b formed on the other side of the winding barrel 6a in the axial direction thereof prevents the operation of removing the covering tape 1b from the winding barrel 6a from being smoothly performed. Therefore, an operator inserts a tool or a finger between the guide flange 6b and the covering tape 1b so as to remove the covering tape 1b forcibly from the winding barrel 6a by pressing the covering tape 1b toward the open side of the winding barrel 6a. It takes much time and labor to perform this operation. While this operation is being performed, component supply operation is suspended and hence apparatuses have a low operation rate.

In order to solve this problem, the present applicant previously a component supply apparatus. In this apparatus, a portion of the periphery of the winding barrel of the reel is movable inward in the radial direction thereof to separate the covering tape from the winding barrel easily by separating the portion from the inner peripheral surface of the covering tape.

The apparatus is capable of easily removing the covering tape from the winding barrel, but has a complicated reel construction. Thus, the apparatus is expensive and problems are likely to occur.

SUMMARY OF THE INVENTION

The present invention has been developed with a view to substantially solving the above described disadvantages and has an object to provide an improved component supply apparatus having a simple winding construction and yet allowing a covering tape to be removed easily from a reel.

In accomplishing these and other objects, according to one aspect of the present invention, there is provided a component supply apparatus for sequentially supplying components to a predetermined position by separating a covering tape from an accommodating tape.

The apparatus includes a reel around which the separated covering tape is wound. The reel comprises a reel body including a winding barrel removably mounted on a driving shaft and a guide flange positioned at one end of the driving shaft.

Also inelastic auxiliary ring having a rotation preventing/engaging portion is removably mounted on a peripheral surface of the winding barrel so as to wind the covering tape on the peripheral surface thereof.

According to another aspect of the present invention, there is provided a component supply apparatus for sequentially supplying components to a predetermined position by separating a covering tape from an accommodating tape.

The apparatus includes a reel around which the separated covering tape is wound. The reel comprises a reel body including a winding barrel removably mounted on a driving shaft and a guide flange positioned at one end of the driving shaft.

Also an elastic auxiliary ring is removably mounted on a peripheral surface of the winding barrel so as to wind the covering tape on a peripheral surface thereof.

BRIEF DESCRIPTION OF TEE DRAWINGS

These and other objects and features of the present invention will become clear from the following description, taken in conjunction with the preferred embodiments thereof, with reference to the accompanying drawings, in which.

DETAILED DESCRIPTION OF THE INVENTION

Before the description of the present invention proceeds, it is to be noted that like parts are designated by like reference numerals throughout the accompanying drawings.

A component supply apparatus according to a first embodiment of the present invention is described below with reference to FIGS. 1 through 5 and 7.

Figure 7:
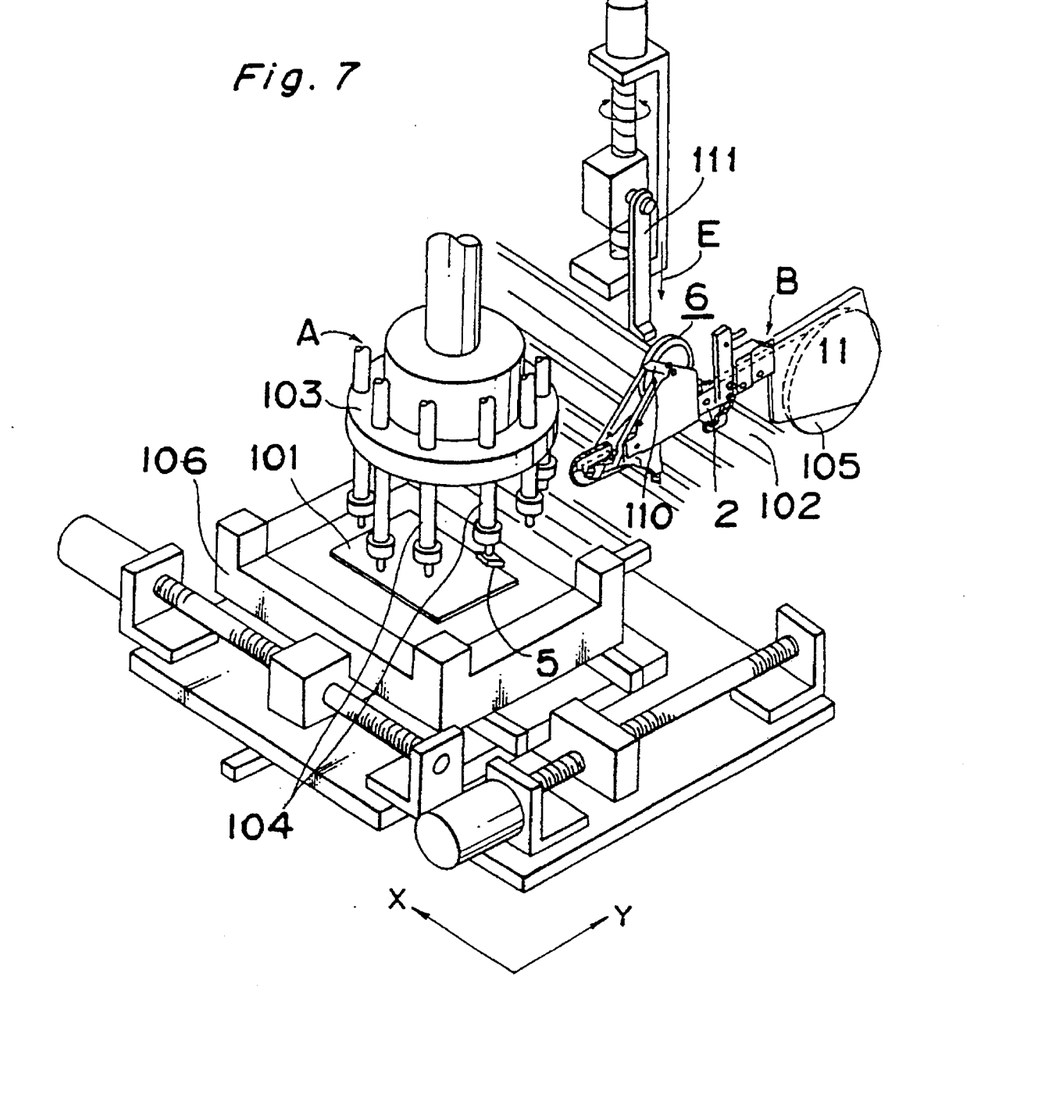
FIG. 7 is a perspective view showing an example of a mounting apparatus which mounts components, in a predetermined position, supplied by the component supply apparatus of the present invention.

In the first embodiment, the component supply apparatus supplies electronic components 5 to a mounting apparatus (A), as shown in FIG. 7, for automatically mounting them on a printed circuit board 101. The component supply apparatus is capable of supplying various kinds of components in addition to the electronic components 5. A component supply table 102 is provided alongside the mounting apparatus (A). Each component supply apparatus (B) holds one kind of component 5. The component supply apparatus (B) holding the components 5, currently required by the mounting apparatus, (A) is selectively moved to a position adjacent the mounting apparatus (A). The component 5 is sucked by a sucking nozzle 104 provided on a component mounting head 103 of the mounting apparatus (A) and mounted on the printed circuit board 101. The printed circuit board 101 is placed on an XY-table 106 movable in an X-direction and a Y-direction perpendicular to each other. The component 5, sucked by the sucking nozzle 104, is transported to a mounting position where it is mounted on the printed circuit board 101 at a predetermined position thereof, while the position of the XY-table 106 is being controlled in the XY-directions. Instead of moving the XY-table 106, the sucking nozzle 104 may be moved in the XY-directions.

Figure 2A:
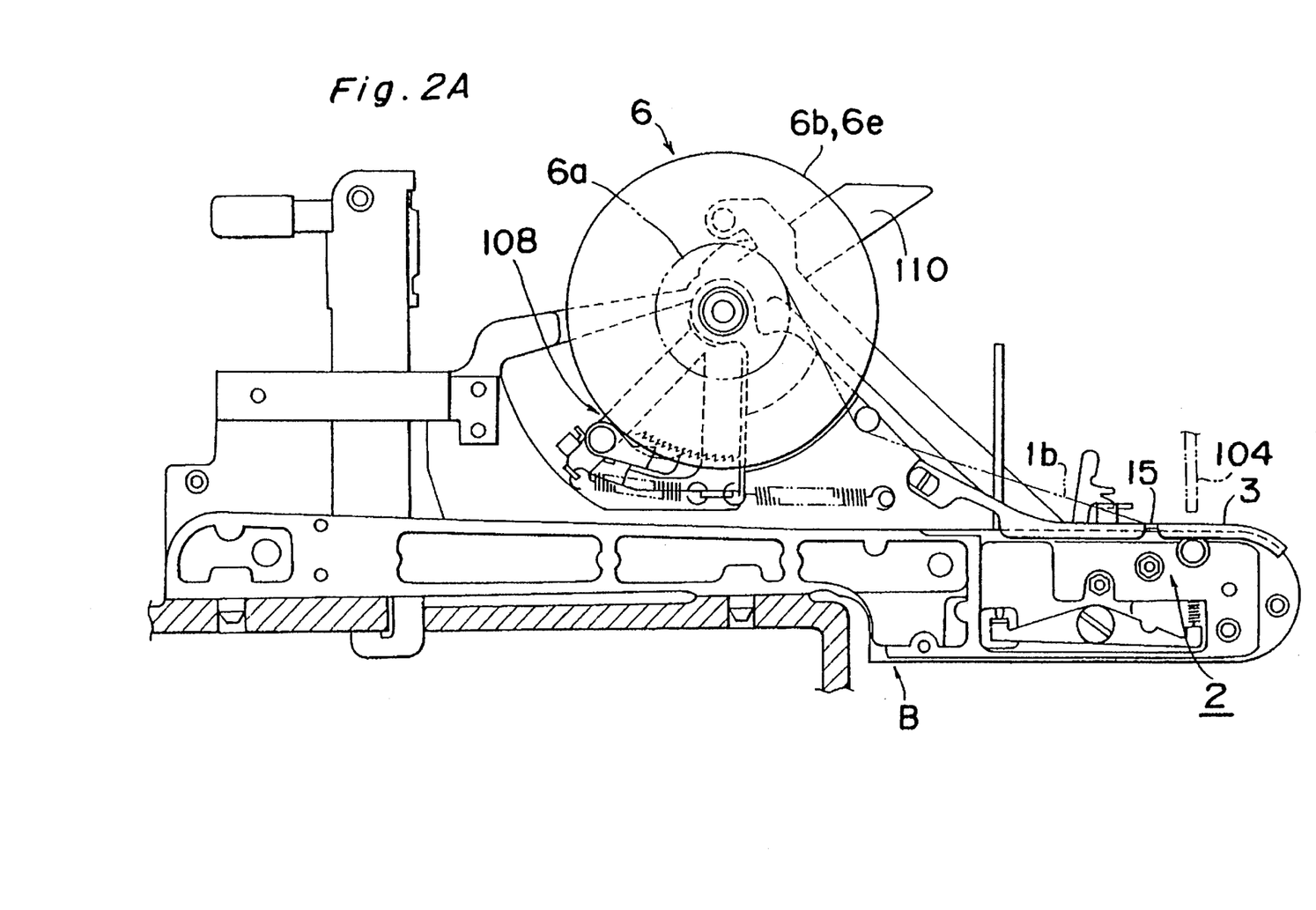
FIG. 2A is a partial side view showing the component supply apparatus shown in FIG. 1A.
Figure 2B:
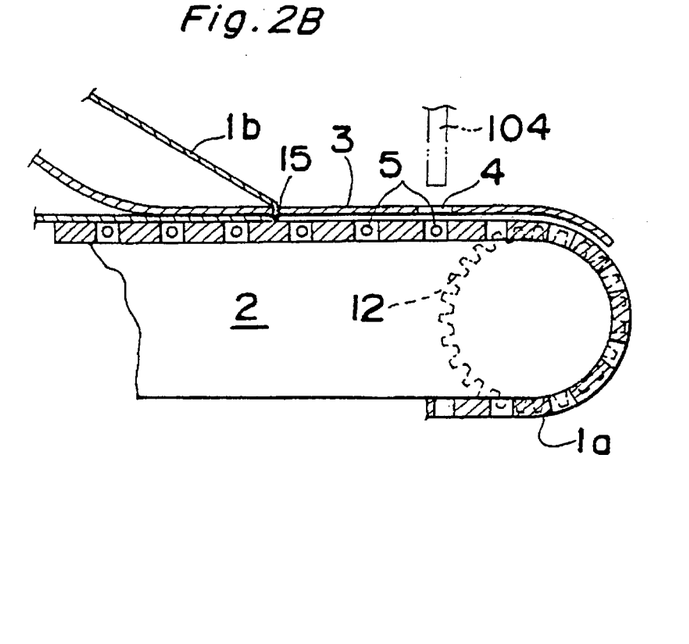
FIG. 2B is a partial sectional view showing the component supply apparatus shown in FIG. 1A.
Figure 2C:
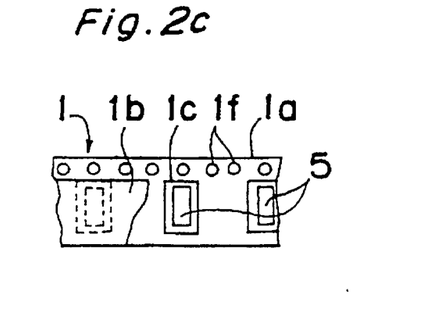
FIGS. 2C and 2D are a plan view and a sectional view showing taped components.
Figure 2D:
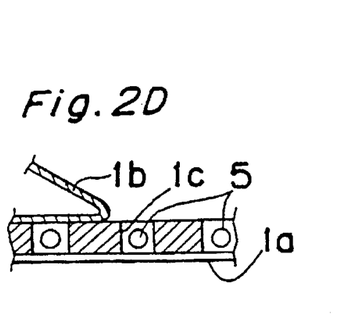
Figure 2E:
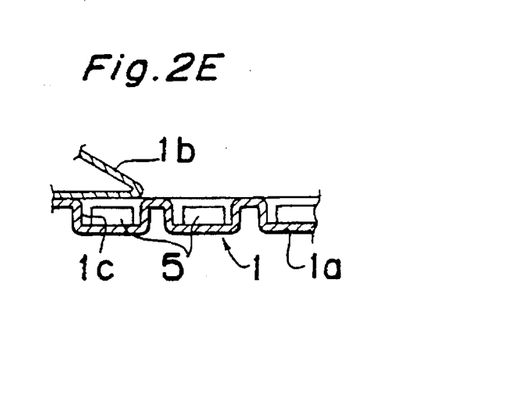
FIG. 2E is a sectional view showing taped components.

In the component supply apparatuses (B), each of the components 5 is accommodated in a component-accommodating portion 1c provided at predetermined intervals along the longitudinal direction of a component-accommodating tape 1a as shown in FIGS. 2C, 2D, and 2E. The taped component (component in taping) 1 is covered with the covering tape 1b is handled as shown in FIGS. 1A, 1B, FIGS. 2A, and 2B. As shown in FIG. 1A, the taped components 1 are wound around a reel 105 which is rotatably and removably mounted on a supporting shaft 11 positioned at the rear end of a component supply guide 2.

In the component supply apparatus (B), the taped components 1 which are wound around the reel 105 are pulled out therefrom along the upper surface of the component supply guide 2 as described previously and moved toward a component supply hole 4 formed in a pressing cover 3 and extending between the upper surface of the component supply guide 2 and the pressing cover 3 covering the leading end of the component supply guide 2. While the taped components 1 are being moved, the covering tape 1b is separated from the accommodating tape 1a accommodating the components 5. The covering tape 16 is wound around a winding barrel 6a of the reel 6 which is made of resin. The component accommodating portion 1c of tape 1a is uncovered as a result of the separation of the covering tape 1b and is transported to the component supply hole 4. In this manner, each of the components 5 is picked up by the sucking nozzle 104 through the component supply opening 4.

In order to transport the taped components 1, the component supply apparatuses (B) has a sprocket 12 at the leading end of the component supply guide 2. The taped components 1, pulled from the reel 105 and pressed by the pressing cover 3, are moved by the rotation of the sprocket 12, with feeding holes 1f formed on the component-accommodating tape 1a in engagement with gear teeth of the sprocket 12.

Referring to FIG. 1B, the reel 6 includes a driving-side reel body 6f comprising a driving shaft 6d mounted on a supporting shaft 13, installed on a middle upper portion of the component supply guide 2, via a one-way clutch 14 in such a manner that the driving shaft 6d rotates only in the winding direction of the covering tape 1b shown by an arrow (C) of FIG. 1B. A guide flange 6e is positioned at one end of the driving shaft 6d in the axial direction thereof. A winding-side reel body 6c having a winding barrel 6a and a guide flange 6b is positioned at one end of the winding barrel 6a in the axial direction thereof. The driving shaft 6d of the driving-side reel body 6f is axially inserted into the winding barrel 6a of the winding-side reel body 6c. Then, the reel body 6c is rotated in the direction shown by an arrow (D) of FIG. 1B so as to engage each engaging portion 6h formed on the inner periphery of the winding barrel 6a with each engaging portion 6j formed on the periphery of the driving shaft 6d. In this manner, the reel body 6c can be prevented from being removed from the driving shaft 6d and further, the reel body 6c rotates in engagement with the driving shaft 6d which rotates in the tape-winding direction shown by the arrow (C) of FIG. 1B. That is, the rotation of the driving shaft 6d in the above-described direction shown by the arrow (C) allows the covering tape 1b to be wound around the winding barrel 6a. As shown in FIG. 1A, FIGS. 2A and 2B, the covering tape 1b is pulled out from a slit 15 formed in the vicinity of the component supply hole 4 of the pressing cover 3 and can be reliably wound around the winding barrel 6a by the guide of the flanges 6b and 6e.

In the periphery of the driving shaft 6d, there is provided a ratchet mechanism 108 comprising a ratchet gear 107 provided on the outer surface of the guide flange 6e integral with the driving shaft 6d. A feed lever 110 is pivotally mounted on the supporting shaft 13. The lever 10 is pivoted by being pressed downward in a direction shown by an arrow (E) of FIG. 7 and FIG. 1A by an operation mechanism 111 provided at the component supply position shown in FIG. 7. The sprocket 12 is driven through a link/lever mechanism 112 and the ratchet mechanism 113 interlocked therewith, and the reel 6 are driven through the ratchet mechanism 108. As a result, the taped components 1 are moved a predetermined amount, and one component 5 is supplied to the mounting apparatus (A) and a predetermined amount of the covering tape 1b is wound around the winding barrel 6a simultaneously. Needless to say, various modifications of this driving mechanism can be made.

In replacing the kind of the component 5 to be supplied to the mounting apparatus (A), it is necessary to remove the covering tape 1b from the reel 6. To this end, the reel body 6c, having the winding barrel 6a and the guide flange 6b positioned at one end thereof, is separated from the driving shaft 6d and the driving-side guide flange 6e, and then the covering tape 1b is removed from the winding barrel 6a of the reel body 6c separated and then made independent.

As described previously, the covering tape 1b is wound around the winding barrel 6a of the reel 6 by separating the covering tape 1b from the accommodating tape 1a. As a result of separation resistance, the covering tape 1b is wound comparatively tight and close around the winding barrel 6a of the reel 6. Accordingly, the wound covering tape 1b cannot be easily removed from the winding barrel 6a. In addition, although no guide flange is formed on one side of the winding barrel 6a, the guide flange 6b formed on the other side of the winding barrel 6a, in the axial direction thereof, prevents the operation of removing the covering tape 1b from the winding barrel 6a from being smoothly performed. Therefore, an operator inserts a tool or a finger between the guide flange 6b and the covering tape 1b so as to remove the covering tape 1b forcibly from the winding barrel 6a by pressing the covering tape 1b toward the open side of the winding barrel 6a. It takes much time and labor to perform this operation. While this operation is being performed, component supply operation is suspended and hence apparatuses have a low operation rate.

In order to solve this disadvantage, an auxiliary ring 21 made of an elastic material is mounted on the outer peripheral surface of the winding barrel 6a so that the covering tape 1b is wound around the auxiliary ring 21.

In this construction, the reel body 6c comprising the winding barrel 6a and the guide flange 6b positioned at one end thereof is mounted on the driving shaft 6d, and the elastic auxiliary ring 21 is mounted around the periphery of the winding barrel 6a due to an elastic engagement therewith so that the covering tape 1b winds around the auxiliary ring 21. Therefore, the auxiliary ring 21 is rotated without slipping on the winding barrel 6a due to the friction caused by the elastic engagement between the auxiliary ring 21 and the winding barrel 6a as well as the guide flange 6b. Therefore, the covering tape 1b can be wound easily around the winding barrel 6a. Thus, it is unnecessary to provide a rotation preventing/engaging portion for preventing the auxiliary ring 21 from slipping on the winding barrel 6a. If the rotation preventing/engaging portion is provided, it is necessary to perform a position-adjusting operation. Then, such a position adjusting operation is not necessary in this embodiment.

After a necessary amount of the covering tape 1b is wound around the winding barrel 6a, the reel body 6c is removed from the driving shaft 6d, and then, the auxiliary ring 21 is removed from the winding barrel 6a together with the covering tape 1b wound around the auxiliary ring 21 by utilizing the construction that one end of the winding barrel 6a in the axial direction thereof is open, namely, the construction that a guide flange is not provided at one end of the winding barrel 6a in an axial direction thereof and by utilizing the elastic force of the auxiliary ring 21. At this time, the auxiliary ring 21 can be easily removed from the winding barrel 6a. Further, there are no obstructions such as no guide flange of the reel in the periphery of the auxiliary ring 21 and the covering tape 1b. Thus, as shown by imaginary lines of FIG. 5C, separation force (F) can be applied to the auxiliary ring 21 at necessary positions of the auxiliary ring 21 and the covering tape 1b with fingers of both hands. The use of the auxiliary ring 21 provides a tape-winding construction which is simple and hardly fails and allows the covering tape 1b wound around the auxiliary ring 21 to be removed from the winding barrel 6a easily and rapidly, thus accomplishing the replacement of the components 5 in a short period of time.

Figure 3A:
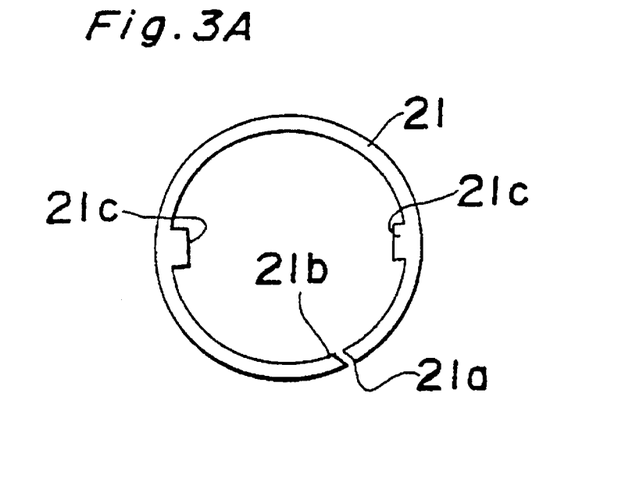
FIG. 3A is a front view showing an auxiliary ring which allows the covering tape to be removed easily therefrom in the apparatus.

As shown in FIG. 3, an open portion 21a is formed on the auxiliary ring 21 so that the auxiliary ring 21 is elastically flexed. That is, the flexure of the open portion 21a enables the auxiliary ring 21 to be mounted easily on the winding barrel 6a and the auxiliary ring 21 to be removed easily from the covering tape 1b because the auxiliary ring 21 is flexed radially inwardly. Therefore, the open portion 21a facilitates the installation of the auxiliary ring 21 on the winding barrel 6a and its removal therefrom and the separation of the auxiliary ring 21 from the covering tape 1b. Resin such as polyacetal is preferably used as the material of the auxiliary ring 21 because polyacetal has an appropriate degree of deformation and is durable. Elastic materials other than polyacetal may be used.

As shown in FIG. 3, one side 21b of the open portion 21a of the auxiliary ring 21 is bent inward. Thus, the auxiliary ring 21 engages the winding barrel 6a with a higher elastic force due to the formation of the bent portion 21b, thus improving a force for preventing the auxiliary ring 21 from slipping on the winding barrel 6a when the auxiliary ring 21 is fitted on the winding barrel 6a. Further, when the auxiliary ring 21 is removed from the winding barrel 6a, the auxiliary ring 21 is inwardly returned by its elasticity to the original configuration toward its center. Hence, the covering tape 1b can be removed from the auxiliary ring 21 very easily. It is possible to bend the other side of the open portion 21a inward to increase the elastic force of the auxiliary ring 21.

Figure 3B:
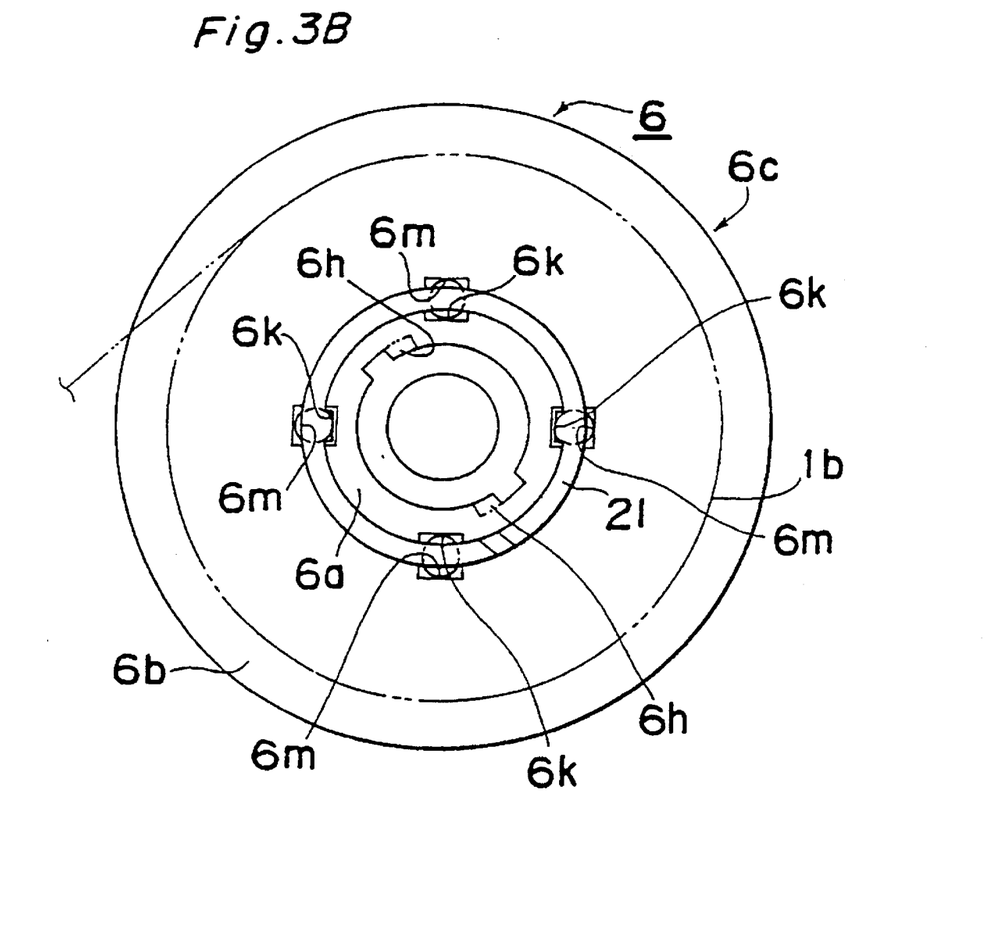
FIG. 3B is a front view showing a reel body on which the covering tape is wound in the apparatus.

The auxiliary ring 21 has two rotation preventing/engaging portions 21c formed at the inner periphery thereof in such a manner that the rotation preventing/engaging portions 21c are symmetrical with each other with respect to the center of the auxiliary ring 21. The two rotation preventing/engaging portions 21c engage two of four grooves 6k formed on the outer periphery of the winding barrel 6a of the reel body 6c. Thus, the auxiliary ring 21 is prevented from slipping on the winding barrel 6a during rotation. Although the two rotation preventing/engaging portions 21c are formed on the auxiliary ring 21 in this embodiment, any number of rotation preventing/engaging portions 21c can be formed on the auxiliary ring 21. It is possible to form the rotation preventing/engaging portions 21c, on the auxiliary ring 21, which engage concaves or holes formed on the guide flange 6b of the reel body 6c.

The provision of the rotation preventing/engaging portions 21c is sufficient to prevent the auxiliary ring 21 from slipping on the winding barrel 6a during rotation. Hence the covering tape 1b can be wound reliably around the winding barrel 6a without any slip.

Accordingly, it is possible to prevent the elastic force of the auxiliary ring 21 from acting in installing the auxiliary ring 21 on the winding barrel 6a and removing it therefrom to make the installing and removing operation easy and allow the elastic force of the auxiliary ring 21 to inwardly act in separating the auxiliary ring 21 and the winding barrel 6a from each other.

As described above, the auxiliary ring 21 elastically engages the winding barrel 6a and in addition, by some possibility, the auxiliary ring 21 is pressed with a great force against the winding barrel 6a by a pressure applied thereto by the covering tape 1b wound around the auxiliary ring 21. Thus, a plurality of, e.g. four jig-inserting holes 6m penetrating from the outer surface of the guide flange 6b to the inner surface thereof are formed at four positions of the guide flange 6b of the reel body 6c in a circumferential direction such that the four positions are slightly radially outward of the periphery of the winding barrel 6a. The jig-inserting holes 6m allow the auxiliary ring 21 to be removed from the winding barrel 6a easily and rapidly together with the covering tape 1b wound around the auxiliary ring 21, by inserting pressing pins 22a of a jig 22 from the outer surface of the guide flange 6b into the jig-inserting holes 6m in a direction shown by an arrow (G) in FIG. 5B. The positions of the grooves 6k of the winding barrel 6a correspond to those of the jig-inserting holes 6m. The grooves 6k also may be used to receive the pressing pins 22a. Therefore, a circle including each outer diameter of the four pressing pins 22a can be set to be larger than the thickness of the auxiliary ring 21. That is, the four pressing pins 22a are so located that when the four pressing pins 22a are inserted into the four jig-inserting holes 6m, the four pressing pins 22a are outwardly projected from the outer periphery of the auxiliary ring 21 so as to be capable of pressing the auxiliary ring 21. Thus, the pressing pins 22a press the auxiliary ring 21 reliably in removing it from the winding barrel 6a.

Figure 4:
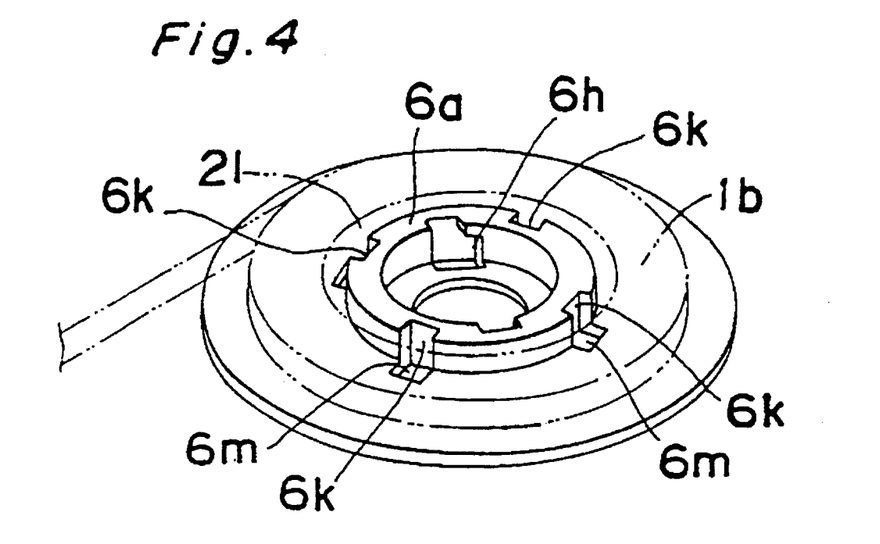
FIG. 4 is a perspective view showing the relationship between the reel body, the auxiliary ring, the covering tape wound around the reel body shown in FIG. 3B, and a jig.

Referring to FIG. 4, the jig 22 has outer and inner threaded holes 22c which are concentrically positioned on different two circles on the jig 22 and the pressing pins 22a have threaded portions 22b, and then the threaded portions 22b are screwed into the inner threaded holes 22c of the jig 22. Hence, the jig 22 is applicable to different size winding barrels 6a, i.e. barrels having different diameters, by adjusting the installing position of the pressing pins 22a. The number of the threaded holes 22c on the outer side is greater than that of those on the inner side so that the pressing pins 22a can press the auxiliary ring 21 having a larger diameter reliably in removing the auxiliary ring 21 from the winding barrel 6a. The number of pressing pins 22a can be appropriately altered as necessary.

Figure 5A:
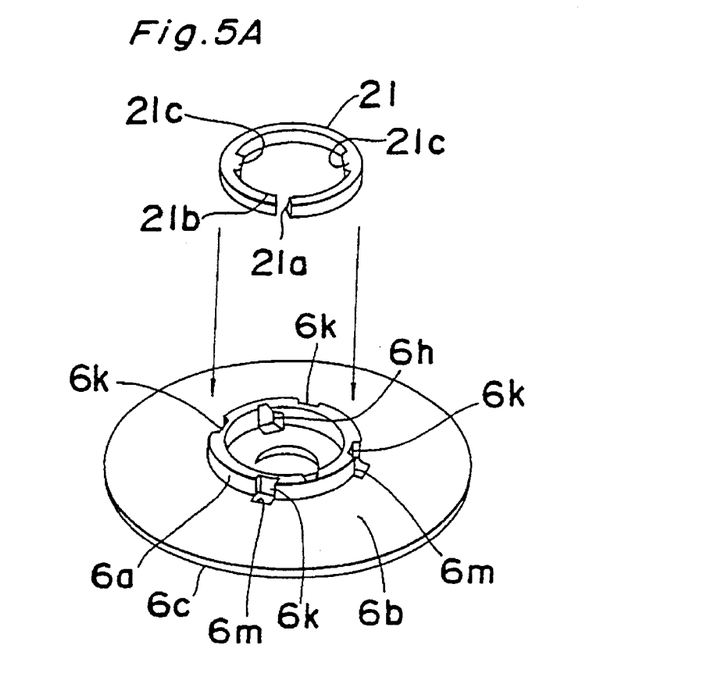
FIGS. 5A, 5B, 5C, and 5D are explanatory views showing the method of handling the reel body and the auxiliary ring.
Figure 5B:
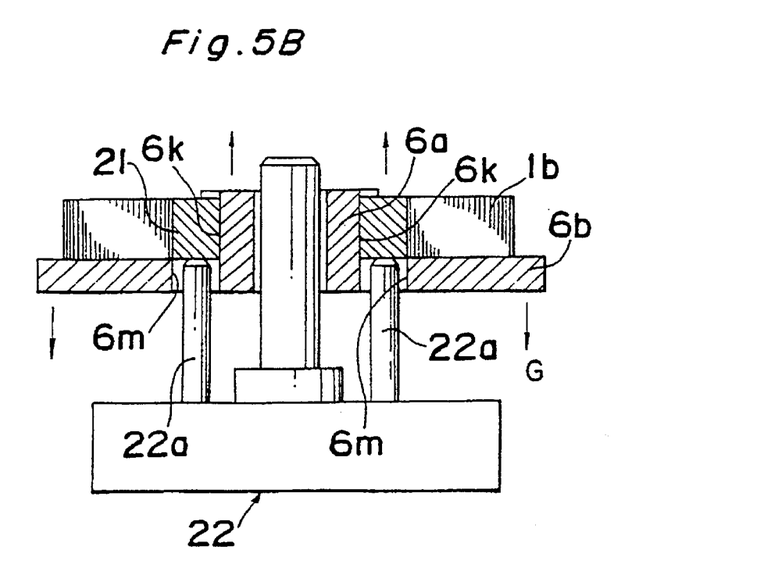
Figure 5C:
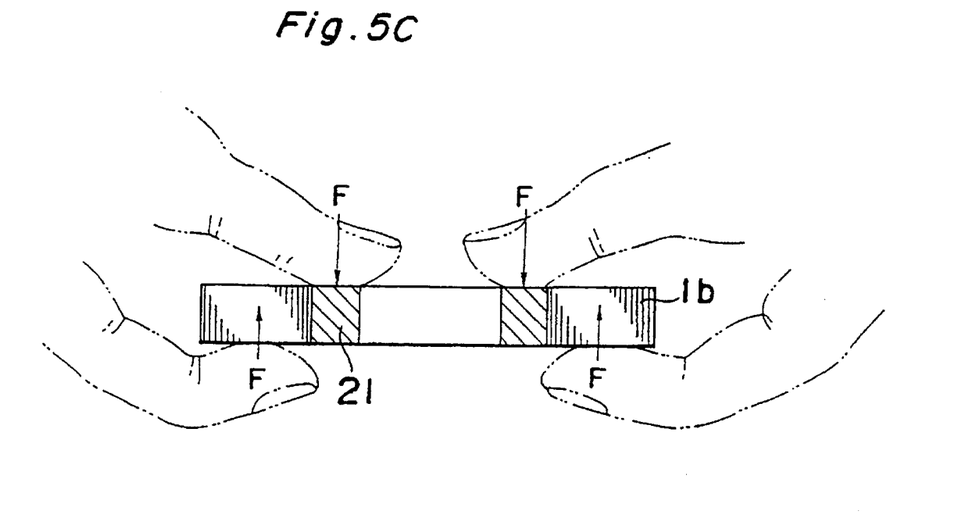
Figure 5D:
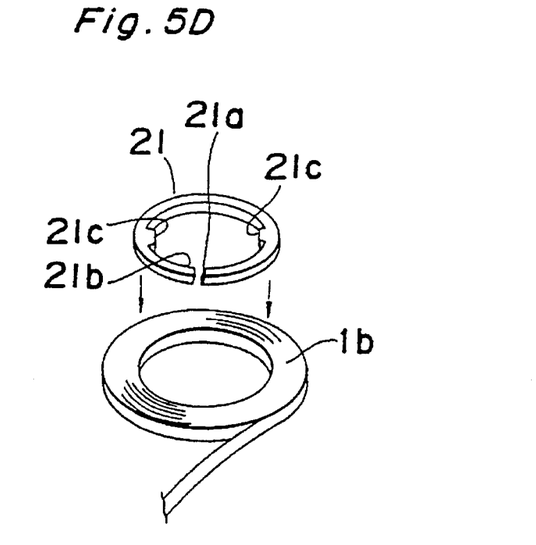

FIG. 5A through 5D show the method of handling the reel body 6c and the auxiliary ring 21. That is, FIG. 5A is a perspective view showing the state of mounting the auxiliary ring 21 on the winding barrel 6a; FIG. 5B is a sectional view showing the state of removing the auxiliary ring 21 with the covering tape 1b wound around the auxiliary ring 21 from the winding barrel 6a with the jig 22; FIG. 5C is a sectional view showing the state of separating the covering tape 1b from the auxiliary ring 21 which has been removed from the winding barrel 6a; and FIG. 5D is a perspective view showing the auxiliary ring 21 and the covering tape 1b separated from the winding barrel 6a.

Figure 6:
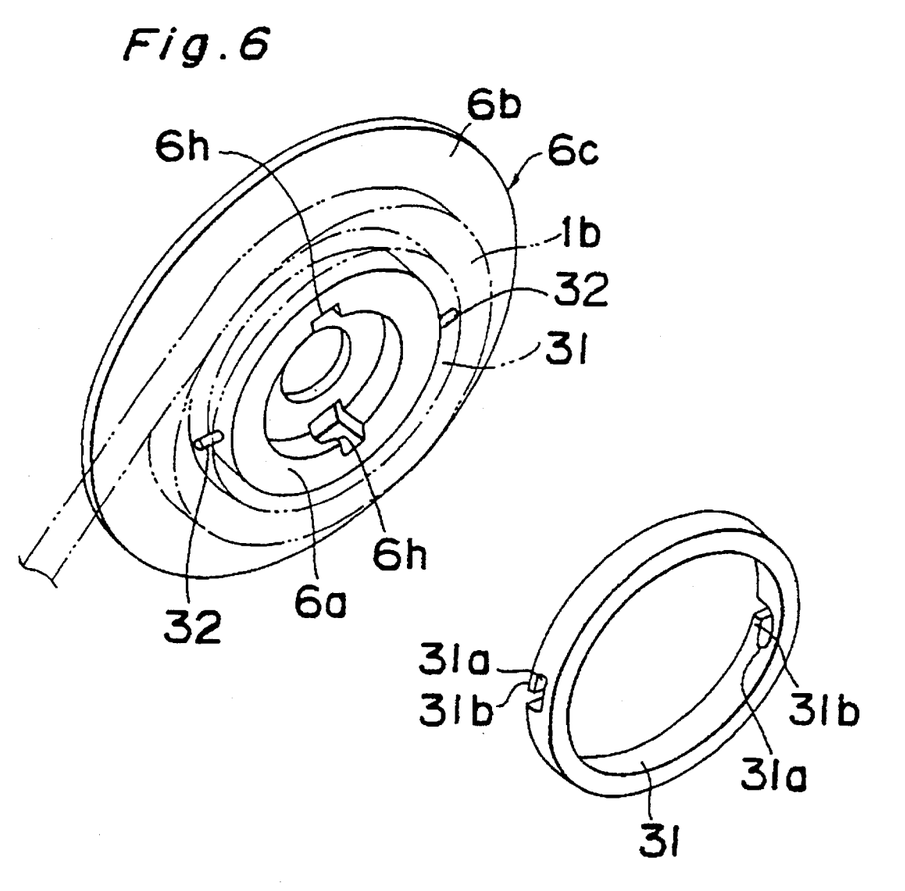
FIG. 6 is a perspective view showing a reel body and an auxiliary ring according to a second embodiment of the present invention.

A component supply apparatus according to a second embodiment of the present invention is described below with reference to FIG. 6.

An auxiliary ring 31 according to the second embodiment is made of an inelastic material such as resin or metal, for example, aluminum unlike the auxiliary ring 21 which is made of an elastic material in the first embodiment.

The auxiliary ring 31 has two rotation preventing/engaging portions 31a each of which removably engages an engaging pin 32 formed on the outer periphery of the winding barrel 6a of the reel body 6c. As in the case of the auxiliary ring 21 according to the first embodiment, the covering tape 1b is wound around the peripheral surface of the auxiliary ring 31. The rotation preventing/engaging portion 31a consists of slits formed at two positions in the peripheral surface of the auxiliary ring 31 in such a manner that the two slits are symmetrical with each other with respect to the center of the auxiliary ring 31. The slits removably engage the engaging pins 32 formed at two positions of the peripheral surface on the winding barrel 6a. The two engaging pins 32 are symmetrical with each other with respect to the center of the winding barrel 6a. Thus, the auxiliary ring 31 is prevented from slipping on the winding barrel 6a during rotation. The rotation preventing/engaging construction may be composed of grooves and projections which engage with each other, similar to the first embodiment. Further, the rotation preventing/engaging construction may be formed on the guide flange 6b. The rotation preventing/engaging construction according to the second embodiment is applicable to the auxiliary ring 21 according to the first embodiment.

The rotation preventing/engaging construction prevents the auxiliary ring 31 from slipping on the winding barrel 6a and allows the auxiliary ring 31 to rotate as an integral part of the winding barrel 6a. Therefore, the auxiliary ring 31 enables the covering tape 1b to be wound around it reliably. Further, the auxiliary ring 31 can be removed from the winding barrel 6a, together with the covering tape 1b, more easily than in the case of the first embodiment because the auxiliary ring 31 is inelastic and hence can be prevented from engaging the winding barrel 6a with a great force. Similarly to the first embodiment, the covering tape 1b, can be separated from the auxiliary ring 31 easily by applying a separation force (F) to necessary portions of the covering tape 1b and the auxiliary ring 31.

The auxiliary ring 31 has a removal preventing/engaging portion 31b at each of the rotation preventing/engaging portions 31a which engages the engaging pin 32 of the winding barrel 6a. In this embodiment, the slit defining the rotation preventing/engaging portion 31a is bent formed in an L-configuration to define the removal preventing/engaging portion 31b. The removal preventing/engaging portion 31b engages the engaging pin 32, thus preventing the auxiliary ring 31 from being removed from the winding barrel 6a. Needless to say, the removal preventing/engaging portion 31b may have other constructions.

The removal preventing/engaging portion 31b prevents the auxiliary ring 31 from being removed from the winding barrel 6a even though the auxiliary ring 31 is loosely engaged with the winding barrel 6a, thus preventing trouble from occurring.

According to the above construction, while the components accommodated in the accommodating tape are being moved to a predetermined position, the covering tape is separated from the accommodating tape and then, wound around the winding barrel of the reel. In this manner, the accommodating tape, having the component accommodating portion exposed to the outside, is fed to the predetermined position.

According to the first embodiment of the present invention, the reel body comprising the winding barrel and the guide flange positioned at one end thereof is mounted on the driving shaft, and the inelastic auxiliary ring is removably mounted around the periphery of the winding barrel in engagement therewith so as to wind the covering tape around the auxiliary ring. Therefore, the auxiliary ring is rotated without slipping on the winding barrel due to the engagement between the auxiliary ring and the winding barrel. Therefore, the covering tape 1b can be wound easily around the winding barrel 6a. In removing the reel body from the driving shaft and separating the covering tape from the winding barrel for replacement of taped components or other purposes, the auxiliary ring is removed from the winding barrel together with the covering tape wound around it. The removal operation is performed by utilizing the construction that one end of the winding barrel in the axial direction thereof is open, namely, the construction that a guide flange is not provided at one end of the winding barrel in the axial direction thereof. Further, the auxiliary ring can be removed from the winding barrel together with the covering tape easily because the auxiliary ring is inelastic and hence can be prevented from engaging the winding barrel with a great force. Further, there are no obstructions along the periphery of the auxiliary ring and the covering tape. Thus, separation force can be applied to the auxiliary ring at the necessary positions of the auxiliary ring and the covering tape 1b with fingers of both hands. The use of the auxiliary ring provides a tape-winding construction which is simple. The construction hardly fails and allows the covering tape wound around the auxiliary ring to be removed from the winding barrel easily and rapidly, thus accomplishing the replacement of the components in a short period of time.

The removal preventing/engaging portion prevents the auxiliary ring from being removed from the winding barrel even though the auxiliary ring is in loose engagement with the winding barrel, thus preventing trouble from occurring.

According to the first embodiment of the present invention, the winding barrel has a construction similar to that of the second embodiment, but the auxiliary ring is made of an elastic material. The elastic auxiliary ring is removably mounted around the periphery of the winding barrel due to the elastic engagement therewith so as to wind the covering tape around the elastic auxiliary ring. Therefore, the auxiliary ring is rotated without slipping on the winding barrel due to the friction between the auxiliary ring and the winding barrel as well as the guide flange. Therefore, the covering tape can be wound easily around the winding barrel. Thus, it is unnecessary to provide a rotation preventing/engaging portion for preventing the auxiliary ring from slipping on the winding barrel which requires a position-adjusting operation. After a necessary amount of the covering tape is wound around the winding barrel, the reel body is removed from the driving shaft, and then, the auxiliary ring is removed from the winding barrel together with the covering tape wound around it by utilizing the construction that one end of the winding barrel in the axial direction thereof is open and by utilizing the elastic force of the auxiliary ring. The use of the auxiliary ring provides a tape-winding construction which is simple and hardly fails and allows the covering tape wound around the auxiliary ring to be removed from the winding barrel easily and rapidly, thus accomplishing the replacement of components in a short period of time.

The open portion is formed in the auxiliary ring so that the auxiliary ring is normally elastically flexed. That is, the flexure at the open portion enables the auxiliary ring to be mounted easily on the winding barrel and the auxiliary ring to be removed easily from the covering tape because the auxiliary ring can be flexed radially inwardly. Therefore, the open portion facilitates the installation of the auxiliary ring on the winding barrel and subsequent removal therefrom, and the separation of the auxiliary ring from the covering tape.

One side (bent portion) of the open portion of the auxiliary ring is bent inwardly. Thus, the auxiliary ring engages the winding barrel with a higher elastic force due to the formation of the bent portion, thus improving force for preventing the auxiliary ring from slipping on the winding barrel when the auxiliary ring is mounted on the winding barrel. Further, when the auxiliary ring is removed from the winding barrel, the auxiliary ring is returned to the original configuration due to the elasticity. Hence, the covering tape can be removed from the auxiliary ring very easily.

The auxiliary ring also has rotation preventing/engaging portions formed at the inner periphery thereof. The provision of the rotation preventing/engaging portions is sufficient to prevent the auxiliary ring from being rotated and slipping on the winding barrel. Hence the covering tape can be wound reliably around the winding barrel. Accordingly, it is possible to prevent the elastic force of the auxiliary ring from acting in installing the auxiliary ring on the winding barrel and removing it therefrom to make the installing and removing operation easy and allow the elastic force of the auxiliary ring to act in separating the auxiliary ring and the winding barrel from each other.

The auxiliary ring elastically engages the winding barrel and in addition, the auxiliary ring is compressed with a great force against the winding barrel by pressure applied thereto by the covering tape wound around the auxiliary ring. Thus, jig-inserting holes penetrating from the outer surface of the guide flange to the inner surface thereof are formed such that the jig-inserting holes are slightly outward of the periphery of the winding barrel. The jig-inserting holes allow the auxiliary ring to be removed from the winding barrel easily and rapidly together with the covering tape wound around the auxiliary ring, by inserting the pressing pins of the jig into the jig-inserting holes.

Although the present invention has been fully described in connection with the preferred embodiments thereof with reference to the accompanying drawings, it is to be noted that various changes and modifications apparent to those skilled in the art. Such changes and modifications are to be understood as included within the scope of the present invention as defined by the appended claims.

What is claimed is:

1. A component supply apparatus for sequentially supplying components accommodated in a tape having a component covering tape and a component accommodating tape, said component supply apparatus comprising:

a reel for receiving the component covering tape after separating from the component accommodating tape, said reel including a drive shaft having first and second ends, a first guide flange fixedly connected to said drive shaft at said first end of said drive shaft, a winding barrel removably mounted on said drive shaft, and a second guide flange connected to said winding barrel and removably positioned at said second end of said drive shaft; and an inelastic auxiliary ring for receiving the covering tape on a peripheral surface thereof, said inelastic auxiliary ring being removably mounted on an outer peripheral surface of said winding barrel and including a rotation preventing portion, wherein said inelastic auxiliary ring is removable from said winding barrel to remove a covering tape wound around said peripheral surface of said inelastic auxiliary ring.

2. The component supply apparatus as claimed in claim 1, further comprising a removal preventing portion provided on said inelastic auxiliary ring, wherein said removal preventing portion engages said winding barrel to prevent inadvertent removal of said inelastic auxiliary ring from said winding barrel.

3. The component supply apparatus as claimed in claim 2, further comprising at least one engaging pin projecting from an outer peripheral surface of said winding barrel, wherein said rotation preventing portion and said removal preventing portion provided on said inelastic auxiliary ring are defined by at least one slit formed in said auxiliary ring, and said slit engages said at least one pin to prevent inadvertent removal of said inelastic auxiliary ring from said winding barrel.

4. A component supply apparatus for sequentially supplying components accommodated in a tape having a component covering tape and a component accommodating tape, said component supply apparatus comprising:

- a reel for receiving the component covering tape after separating from the component accommodating tape,
- said reel including a driving shaft having first and second ends,
- a first guide flange fixedly connected to said drive shaft at said first end,
- a winding barrel removably mounted on said drive shaft, and
- a second guide flange connected to said winding barrel and removably positioned at said second end of said drive shaft; and
- an elastic auxiliary ring having a peripheral surface for receiving a covering tape, said elastic auxiliary ring being removably mounted on an outer peripheral surface of said winding barrel so as to be positioned on said second guide flange and elastically engaging said peripheral surface of said winding barrel, wherein said elastic auxiliary ring is removable from said winding barrel to remove a covering tape wound around said peripheral surface of said elastic auxiliary ring.

5. The component supply apparatus as claimed in claim 4, wherein a plurality of jig-inserting holes are formed in said second guide flange such that said jig-inserting holes are located in positions corresponding to said outer peripheral surface of said winding barrel.

6. The component supply apparatus as claimed in claim 4, further comprising a rotation preventing portion formed on said auxiliary ring and engaging said winding barrel to prevent slipping of said auxiliary ring relative to said winding barrel.

7. The component supply apparatus as claimed in claim 6, wherein a plurality of jig-inserting holes are formed in said second guide flange such that said jig-inserting holes are located in positions corresponding to said outer peripheral surface of said winding barrel.

8. The component supply apparatus as claimed in claim 4, wherein said elastic auxiliary ring has two opposing ends, and at least one end of said elastic auxiliary ring normally extends inwardly of said ring.

9. The component supply apparatus as claimed in claim 8, wherein a plurality of jig-inserting holes are formed in said second guide flange such that said jig-inserting holes are located in positions corresponding to said outer peripheral surface of said winding barrel.

10. The component supply apparatus as claimed in claim 8, further comprising a rotation preventing portion formed on said auxiliary ring and engaging said winding barrel to prevent slipping of said auxiliary ring relative to said winding barrel.

11. The component supply apparatus as claimed in claim 10, wherein a plurality of jig-inserting holes are formed in said second guide flange such that said jig-inserting holes are located in positions corresponding to said outer peripheral surface of said winding barrel.

12. The component supply apparatus as claimed in claim 4, wherein said auxiliary ring has an open portion defining two opposing ends.

13. The component supply apparatus as claimed in claim 12, wherein a plurality of jig-inserting holes are formed in said second guide flange such that said jig-inserting holes are located in positions corresponding to said outer peripheral surface of said winding barrel.

14. The component supply apparatus as claimed in claim 12, further comprising a rotation preventing portion formed on said auxiliary ring and engaging said winding barrel to prevent slipping of said auxiliary ring relative to said winding barrel.

15. The component supply apparatus as claimed in claim 12, wherein a plurality of jig-inserting holes are formed in said second guide flange such that said jig-inserting holes are located in positions corresponding to said outer peripheral surface of said winding barrel.

* * * * *